US010725446B2

(12) United States Patent
Mercelis

(10) Patent No.: US 10,725,446 B2
(45) Date of Patent: Jul. 28, 2020

(54) METHOD AND DEVICE FOR CALIBRATING MULTIPLE ENERGY RAYS FOR THE ADDITIVE MANUFACTURING OF AN OBJECT

(71) Applicant: LAYERWISE N.V., Heverlee (BE)

(72) Inventor: Peter Mercelis, Heverlee (BE)

(73) Assignee: LAYERWISE, Heverlee (BE)

( * ) Notice: Subject to any disclaimer, the term of this patent is extended or adjusted under 35 U.S.C. 154(b) by 22 days.

(21) Appl. No.: 15/101,181

(22) PCT Filed: Dec. 3, 2014

(86) PCT No.: PCT/IB2014/066561
§ 371 (c)(1),
(2) Date: Jun. 2, 2016

(87) PCT Pub. No.: WO2015/083104
PCT Pub. Date: Jun. 11, 2015

(65) Prior Publication Data
US 2016/0303806 A1    Oct. 20, 2016

(30) Foreign Application Priority Data
Dec. 3, 2013    (BE) .................................. 2013/0811

(51) Int. Cl.
| | |
|---|---|
| *G05B 19/401* | (2006.01) |
| *G01B 21/04* | (2006.01) |
| *G03F 7/00* | (2006.01) |
| *G03F 7/20* | (2006.01) |
| *B33Y 50/02* | (2015.01) |
| *B29C 64/386* | (2017.01) |

(Continued)

(52) U.S. Cl.
CPC .......... *G05B 19/401* (2013.01); *B29C 64/386* (2017.08); *B33Y 50/02* (2014.12); *G01B 21/042* (2013.01); *G03F 7/0037* (2013.01); *G03F 7/704* (2013.01); *G03F 7/7005* (2013.01); *G03F 7/70383* (2013.01); *G03F 7/70416* (2013.01); *G03F 7/70466* (2013.01); *G03F 7/70475* (2013.01); *G03F 7/70516* (2013.01);

(Continued)

(58) Field of Classification Search
CPC .................................................. B29C 67/0088
See application file for complete search history.

(56) References Cited

U.S. PATENT DOCUMENTS 4,660,981 A * 4/1987 Stridsberg ............ G02B 26/101
356/398
4,843,246 A * 6/1989 Benes ................ B23K 15/0013
250/397

(Continued)

FOREIGN PATENT DOCUMENTS

| DE | 19957370 A1 | 6/2001 |
|---|---|---|
| DE | 102009016585 A1 | 10/2010 |

(Continued)

*Primary Examiner* — Raymond L Nimox
(74) *Attorney, Agent, or Firm* — Browdy and Neimark, PLLC

(57) ABSTRACT

The invention concerns a method and a device for calibrating at least one scanning system (4, 5, 17) when producing an object (8) by additive manufacturing, wherein the coordinates of one or several reference positions are measured in the relative coordinate system of each scanning system (4, 5, 17), after which the calibration of each of the scanning systems is adapted starting from the measured coordinates of the reference positions.

16 Claims, 3 Drawing Sheets

(51) Int. Cl.
*G05B 19/4099* (2006.01)
*B33Y 10/00* (2015.01)
*B29C 64/135* (2017.01)
*B29C 64/153* (2017.01)
*B22F 3/105* (2006.01)
*B33Y 30/00* (2015.01)
*B33Y 40/00* (2020.01)
*B29L 9/00* (2006.01)

(52) U.S. Cl.
CPC ........ *G05B 19/4099* (2013.01); *B22F 3/1055* (2013.01); *B22F 2003/1056* (2013.01); *B29C 64/135* (2017.08); *B29C 64/153* (2017.08); *B29L 2009/00* (2013.01); *B33Y 10/00* (2014.12); *B33Y 30/00* (2014.12); *B33Y 40/00* (2014.12); *G05B 2219/49002* (2013.01); *Y02P 10/295* (2015.11)

(56) References Cited

U.S. PATENT DOCUMENTS

| | | | | |
|---|---|---|---|---|
| 5,753,171 A * | 5/1998 | Serbin | ................ | B29C 35/0288 250/492.1 |
| 9,205,690 B2 * | 12/2015 | Leavitt | ................ | B41J 29/393 |
| 2005/0141734 A1 * | 6/2005 | Widmer | ................ | A61F 11/008 381/312 |
| 2006/0227338 A1 * | 10/2006 | Buchler | ................ | A61C 19/04 356/612 |
| 2007/0211846 A1 * | 9/2007 | Zhou | ................ | A61B 6/04 378/4 |
| 2009/0060386 A1 * | 3/2009 | Cooper | ................ | B23K 33/00 382/294 |
| 2010/0264302 A1 * | 10/2010 | Philippi | ................ | B23K 26/046 250/252.1 |
| 2011/0317890 A1 * | 12/2011 | Baroni | ................ | G06T 17/00 382/128 |
| 2013/0056910 A1 * | 3/2013 | Houbertz-Krauss | ... | B33Y 30/00 264/401 |
| 2015/0085297 A1 * | 3/2015 | Hughes | ................ | G01S 17/42 356/482 |

FOREIGN PATENT DOCUMENTS

| | | |
|---|---|---|
| EP | 0148138 A1 | 7/1985 |
| EP | 0375097 A2 | 6/1990 |
| WO | 2015003937 A1 | 1/2015 |

\* cited by examiner

METHOD AND DEVICE FOR CALIBRATING MULTIPLE ENERGY RAYS FOR THE ADDITIVE MANUFACTURING OF AN OBJECT

The invention concerns a method for calibrating a device for manufacturing at least one object by means of an additive manufacturing technique starting from a raw material whereby this raw material is applied in successive layers in a building zone. Each of these successive layers defines one and the same building plane. After the application of each layer, several energy rays such as laser beams or electrode rays are simultaneously or sequentially moved over said layer so as to form successive cross-sections of said object and to thus build the latter layer by layer.

In this method, a number of sectors are determined which extend at least partly in said building zone. Every sector is covered by at least one corresponding energy ray.

For every sector, corresponding scan means are provided to move the point of incidence of the ray in the building zone over said sector according to a predetermined pattern in order to form the successive cross-sections of the object.

Additive manufacturing techniques such as for example Selective Laser Sintering, Selective Laser Melting or Electron Beam Melting make use of scan means to direct a beam or electromagnetic radiation to a building zone. For laser-based systems these scan means include for example what is called a galvano scanner in which a laser beam is moved over the building zone with one or several motorized movable mirrors according to a two-dimensional cross-section of the object to be built. In the case of an electron beam, it will be moved in a controlled manner over the building zone by scan means containing one or several magnetic deflection coils.

When large objects are to be made, a correspondingly large construction zone will be required which is to be covered by energy rays. This can be achieved by increasing the focal length of the scan means, so that a larger surface area can be covered. This is disadvantageous, however, in that the resolution and/or accuracy of the additive manufacturing technique decreases considerably.

The minimum diameter of the focal point of an energy ray, such as for example a laser beam, which can be obtained is related to the focal length. When the focal length increases, said minimum diameter of the focal point in the construction zone will increase as well. Since the resolution of the additive manufacturing technique is defined among others by the minimum diameter of the focal point of the energy ray, the resolution of the manufacturing process will decrease when the focal length increases.

Moreover, the positional accuracy of the scan means decreases when the area over which the energy ray has to move increases.

Thus, for manufacturing large objects, several energy rays are preferably used which can each be moved over a different sector of the construction zone to thus build up another part of the object. This makes it possible to apply a short focal length and to achieve an additive manufacturing process with a high resolution.

When using several energy rays with corresponding scan means to build up one and the same object, they must be nearly perfectly aligned with each other, such that in the object to be built there will be for example no discontinuities or other defects in the transition between two adjacent sectors.

The invention aims to provide a solution by proposing a method and a device making it possible to almost perfectly calibrate scan means of the different sectors of the construction zone, both before an object is manufactured and during the actual manufacturing of the object.

Practically, in the method according to the invention, for each sector, a sector coordinate system is associated with the corresponding scan means of this sector, with a relation between this sector coordinate system and a reference coordinate system being determined by an initial transformation function.

Said point of incidence is moved to a least one measuring position with the help of said scan means. This measuring position has sector coordinates which are defined in the sector coordinate system associated with the relevant scan means. In this measuring position, the reference coordinates of the point of incidence are determined in the reference coordinate system.

For at least one measuring position, the deviation is determined between said reference coordinates of the point of incidence and coordinates of said measuring position in the above-mentioned reference coordinate system which are obtained by applying the initial transformation function on said sector coordinates.

On the basis of the thus determined deviation for at least one measuring position, and preferably for two, three or more measuring positions, a corrected transformation function is established in such a way that the coordinates of said measuring position in the reference coordinate system are substantially the same as the coordinates obtained by applying the corrected transformation function to the sector coordinates of this measuring position.

This method is preferably applied to calibrate the different scan means before the production of the object is started. However, the method can also be applied while the object is being manufactured. Thus a calibration according to the method of the invention can take place for example after one or several successive cross-sections of the object have been manufactured.

In an advantageous manner, said sectors are selected such that connecting sectors at least partially overlap. At least one measuring position, and preferably two, three or more measuring positions are hereby selected which is/are common to these connecting sectors.

According to a preferred embodiment of the method according to the invention, a detection position is selected for said measuring position with predetermined coordinates in said reference coordinate system, whereby it is detected when the point of incidence is situated in this detection position so as to determine said sector coordinates of said measuring position. Thus, when it is detected that the point of incidence coincides with the detection position, the reference coordinates of the point of incidence will be identical to those of the detection position in the reference coordinate system. Next, said deviation is determined.

Preferably, said point of incidence is moved to said measuring position by scanning a zone containing said detection position with the corresponding ray.

According to an interesting embodiment of the method according to the invention, the reference coordinates of said point of incidence are measured in the measuring position by means of a camera system which is fixed in relation to said reference coordinate system and which contains one or several cameras.

According to a special method of the invention, the reference coordinates of said point of incidence are determined in the measuring position by measuring a position with maximum levels of electromagnetic radiation in said reference coordinate system, wherein the position with this maximum radiation corresponds to the position of said point of incidence.

Other particularities and advantages of the invention will become clear from the following description of a few specific embodiments of the method and device according to the invention. This description is merely given as an example and does not limit the scope of the claimed protection in any way; the reference numerals used below relate to the accompanying figures.

In the different figures, the same reference numerals refer to identical or analogous elements.

The invention concerns a device for manufacturing an object with an additive manufacturing technique, whereby this object is constructed in layers. To this end, successive layers of a raw material in powdered form are applied in a construction zone for this object, whereby one or several energy rays scan over these successive layers according to a predetermined pattern so as to form successive cross-sections of the object.

More specifically, the invention concerns a method for calibrating different scan means which move two or more energy rays over the construction zone in order to manufacture one and the same or possibly multiple objects.

The invention can be applied in different types of additive manufacturing techniques, such as for example Selective Laser Sintering, Selective Laser Melting or Electron Beam Melting. In this description, reference will be made, by way of example, to an additive manufacturing technique that uses a laser beam, in particular Selective Laser Melting, but naturally also other types of energy rays can be applied, such as for example an electrode ray.

Figure 1:
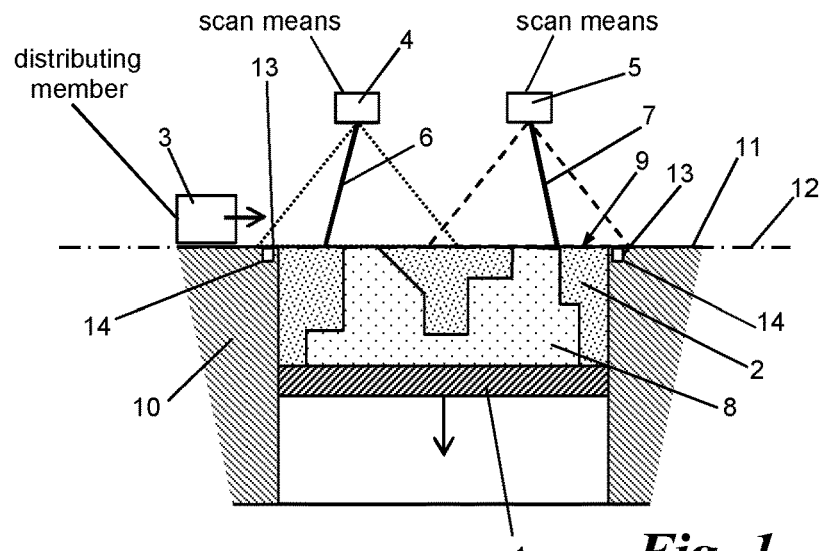
FIG. 1 is a schematic vertical cross-section of a device for additive laser melting.

FIG. 1 schematically represents a cross-section of a part of a device for manufacturing an object by selective laser melting. This device has a vertically movable construction platform 1 on which successive layers of a powdered raw material 2, such as for example titanium powder, are distributed with the aid of a distributing member 3.

After applying each layer of raw material, scan means 4 and 5 are activated which ensure that energy rays, more specifically laser rays 6 and 7, scan according to a predetermined pattern over the layer of raw material to form a cross-section of the object 8 to be manufactured. At the point of incidence where the energy ray 6 or 7 strikes the layer, the powdered raw material 2 will melt at least partially, so that said cross-section is obtained after its solidification. The scan means 4 and 5 include for example an energy ray, such as a laser ray 6 or 7, and orientation means for this ray such as one or several galvano scanners. The latter consist for example of motorized mirrors which make it possible to move said rays 6 and 7 according to said pattern over the layer of raw material.

After a cross-section of the object 8 has been formed, said construction platform 1 moves down over a distance which corresponds to the thickness of the last applied layer of powdered raw material 2. Then the next layer of raw material is applied by means of the distributing member 3 so as to form a subsequent cross-section of the object 8. These successive steps are thus repeated until the entire object 8 has been made.

The zone in which every layer of powdered raw material 2 is distributed above the construction platform 1 is also called the construction zone 9 in this description. This construction zone 9 is laterally bounded by a frame 10 with a flat top side 11. This construction zone 9 and the top side 11 of the frame 10 extend in one and the same build plane 12 and thus define the latter.

Figure 2:
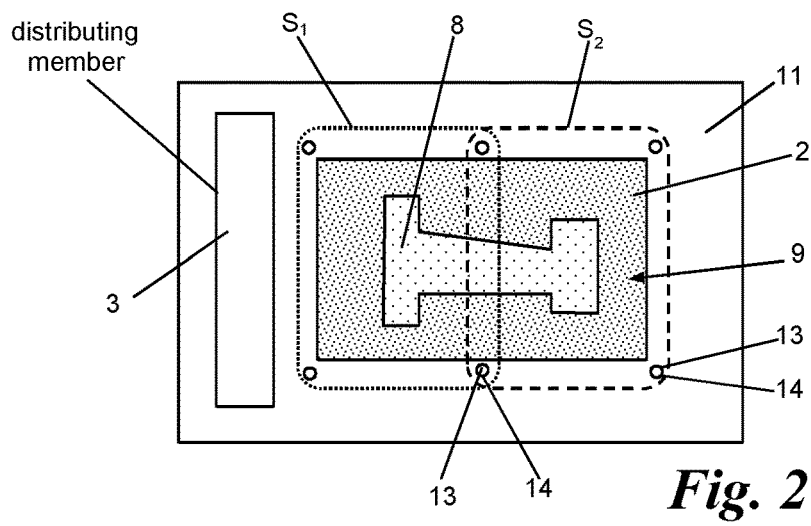
FIG. 2 is a schematic top view of the construction zone of the device from FIG. 1.

In the embodiment of the device represented in FIGS. 1 and 2 are used two energy rays 6 and 7 with each time corresponding scan means 4 and 5. Each of these scan means 4 and 5 defines a corresponding sector $S_1$ and $S_2$ over which the respective ray 6 or 7 can be moved. Each sector is therefore covered by at least one corresponding energy ray 6 or 7. The sectors $S_1$ and $S_2$ of the scan means 4 and 5 each extend over a part of the cross-section of the object 8 to be made, so that both sectors $S_1$ and $S_2$ together cover this entire cross-section.

Preferably, sectors $S_1$ and $S_2$ extend over the entire surface of the construction zone 9, and where sectors $S_1$ and $S_2$ connect, they overlap each other. When manufacturing an object 8 on the basis of a digital three-dimensional model of this object, the scan means 4 and 5 are controlled so as the move the point of incidence of the corresponding rays 6 and 7 over the construction zone 9 in the build plane 12 according to a pattern defining a cross-section of the object 8.

To this end, for each sector $S_1$ and $S_2$, a sector coordinate system $X_{S1}Y_{S1}Z_{S1}$ and $X_{S2}Y_{S2}Z_{S2}$ respectively is associated with the corresponding scan means 4 and 5 of this sector. Further, a reference coordinate system is selected in which the coordinates of the entire object 8 are defined. In order to make it possible to manufacture the object by controlling the scan means of the different sectors, the relation between each sector coordinate system $S_1$ and $S_2$ and said reference coordinate system is determined by an initial transformation function $F_1$ and $F_2$ respectively.

Thus, the coordinates $(x_r, y_r, z_r)$ of the object 8 in the reference coordinate system $X_R Y_R Z_R$ in a sector can be obtained by applying the transformation function concerned to the corresponding coordinates $(x_s, y_s, z_s)$ in the sector coordinate system, so that: $(x_r, y_r, z_r) = F(x_s, y_s, z_s)$ or, vice versa, $F^{-1}(x_r, y_r, z_r) = (x_s, y_s, z_s)$. For the sector $S_1$ applies therefore that $(x_r, y_r, z_r) = F_1(x_1, y_1, z_1)$, whereas for the sector $S_2$ applies that $(x_r, y_r, z_r) = F_2(x_2, y_2, z_2)$. $(x_1, y_1, z_1)$ are hereby coordinates expressed in the sector coordinate system for sector $S_1$, and $(x_2, y_2, z_2)$ are coordinates in the sector coordinate system of the sector $S_2$.

In order to manufacture the object 8 in an accurate manner without any discontinuities in the transition between two adjacent sectors, it is extremely important for deviations in the alignment or calibration of the different scan means to be detected and corrected. In other words, there must be ensured that, for a point situated in both adjacent sectors, the coordinates of this point in the reference coordinate system are practically identical to the coordinates obtained by applying said transformation function to the sector coordinates of this point for both sectors. Deviations in these coordinates result for example in discontinuities in the object and in a production process with a lower resolution.

Since the deviation of the coordinates according to a vertical direction, in particular according to the direction of the Z-axis, usually is of minor importance compared to the deviation of the coordinates in the build plane 12, only the coordinates according to the X-axis and Y-axis in this build plane 12 will be considered below.

In order to calibrate the different scan means according to the invention, the point of incidence of the energy ray on the build plane is moved to at least one measuring position with the help of said scan means. This measuring position has sector coordinates which are defined in the sector coordinate system associated with these scan means. Next, the reference coordinates of the point of incidence in this measuring position are determined in the reference coordinate system.

Figure 3:
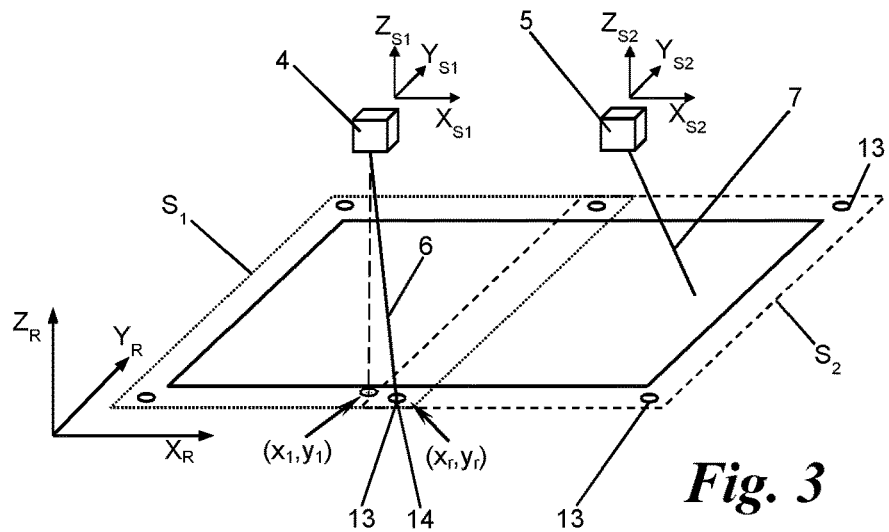
FIG. 3 is a schematic view in perspective of the construction zone from the device in FIGS. 1 and 2.

In the embodiment of the device represented in FIGS. 1 to 3, different measuring positions 13 are provided in the build plane 12 on the top side 11 of said frame 10. Further, a reference coordinate system $X_R Y_R Z_R$ is selected which is fixed with respect to the build plane 12, in particular with respect to the top side 11 of the frame 10.

The location of the measuring positions 13 is selected such that they are situated within sectors $S_1$ and/or $S_2$ of the scan means 4 and 5 concerned. In the given example, two of such measuring positions 13 fall in the overlapping part of the connecting sectors $S_1$ and $S_2$.

Each of these measuring positions 13 forms a detection position with known coordinates in said reference coordinate system $X_R Y_R Z_R$. These coordinates of the detection positions may be measured in advance, for example. In order to calibrate the scan means of a sector, the point of incidence of the ray on the build plane will be moved by the scan means to at least one point of measurement. As represented in FIG. 3, the ray 6 of sector $S_1$ will be moved until its point of incidence reaches the measuring position 13 with known reference coordinates $(x_r, y_r)$.

To this end, a sensor 14 is provided on each of said detection positions. This sensor 14 makes it possible to detect when the point of incidence of the ray 6 is situated in the detection position. This can be done for example by measuring the intensity of the incident energy on the sensor. A threshold value is set hereby such that, when this threshold value is exceeded, it will be derived that the point of incidence of the ray is situated in the detection position with known reference coordinates.

The point of incidence is thereby moved to the measuring position, or detection position, by scanning a selected zone containing the detection position with the ray 6.

When it is thus detected that the point of incidence of the ray 6 hits the measuring position 13, the sector coordinates $(xs_1, ys_1)$ of this measuring position will be determined in the corresponding sector coordinate system $X_{S1} Y_{S1} Z_{S1}$. These sector coordinates $(x_{s1}, y_{s1})$ are the coordinates of the position in the sector coordinate system to which the point of incidence is moved in order to reach said measuring position as is schematically represented in FIG. 3.

When the initial transformation function $F_1$ is applied to these sector coordinates $(xs_1, ys_1)$, coordinates $(x_1, y_1)$ will be obtained in the reference coordinate system which are different from the real reference coordinates $(x_r, y_r)$ of the point of incidence in the measuring position 13. Thus it can be said that $(x_1, y_1) = F_1(xs_1, ys_1)$, whereby $(x_r, y_r) = (x_1 + a, y_1 + b)$. The values a and b therefore correspond to the deviation that must be corrected for the measuring position concerned.

In this manner, the deviation is determined, for at least one measuring position and preferably for two, three or more measuring positions, between the reference coordinates of the point of incidence and coordinates, in the reference coordinate system, of the measuring position obtained by applying the initial transformation function to the relevant sector coordinates.

On the basis of this deviation (a,b), a corrected transformation function $F_{C1}$ is subsequently calculated for at least one measuring position, and preferably for two, three or more measuring positions, for the scan means of the sector $S_1$. The coordinates of the measuring positions 13 in the reference-coordinate system will then be practically equal to the coordinates obtained by applying the corrected transformation function $F_{C1}$ to the sector coordinates of these measuring positions.

Thus, according to the above-described method, the scan means are normally calibrated before the production of an object is started, but it can also be repeated during the manufacture of the object. It can be done, for example, between the manufacture of successive cross-sections.

In order to avoid that said sensors 14 or the top side 11 of the frame 10 might be damaged by the incident energy rays thereon, the power of the rays can be reduced when moving them to the measuring position for scanning said selected zone containing the detection position.

Said sensors may for example consist of photo-diodes or other types of radiation detectors. These sensors can also be replaced by one or several camera systems which detect when the point of incidence of the energy ray hits the predetermined measuring position.

Figure 4:
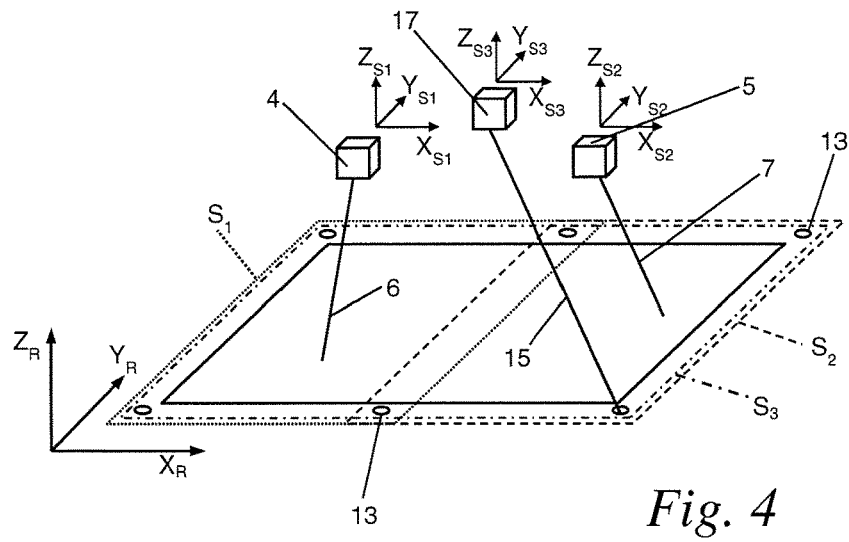
FIG. 4 is a schematic view in perspective of a construction zone from the device with three overlapping sectors.

FIG. 4 schematically represents a variant of the preceding embodiment of the invention. Thus, the construction zone 9 in this embodiment is covered by three sectors $S_1$, $S_2$ and $S_3$ with relevant scan means. A sector $S_3$ hereby entirely overlaps the construction zone 9 and two other sectors $S_1$ and $S_2$. The sectors $S_1$ and $S_2$ connect, whereby they only partially overlap one another.

In such an embodiment, the focal length of the energy ray 15 that is associated with the scan means of the sector S3 will be larger for example than that of the rays 6 and 7 of the scan means covering the sectors $S_1$ and $S_2$. Additionally, this energy ray 15 may have a higher capacity and a larger focal point diameter than rays 6 and 7. This makes it possible to form the outline of an object with a high resolution by means of the rays 6 and 7, while the ray 15 forms the volume inside the outline of the object with a lower resolution, but at a higher speed.

The scan means of these sectors $S_1$, $S_2$ and $S_3$ are calibrated in an analogous manner as described with reference to the embodiment of FIGS. 1 to 3.

Figure 5:
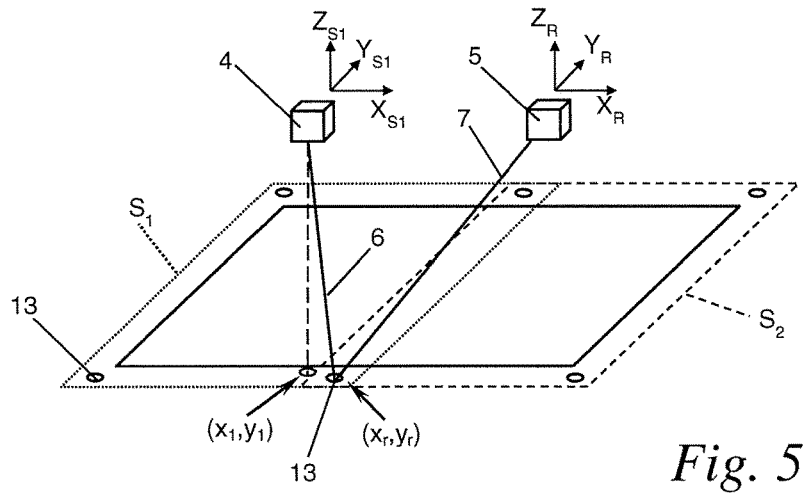
FIG. 5 is a schematic view in perspective of a construction zone wherein the reference coordinate system coincides with a sector coordinate system.
Figure 6:
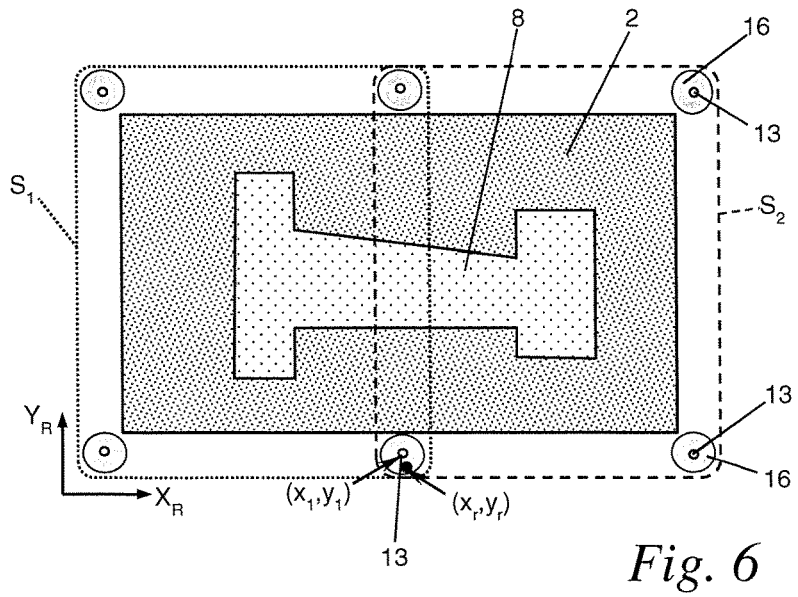
FIG. 6 is a schematic top view of a construction zone whereby the reference coordinates of the point of incidence of a laser beam in the measuring position are measured by means of a camera system.
Figure 7:
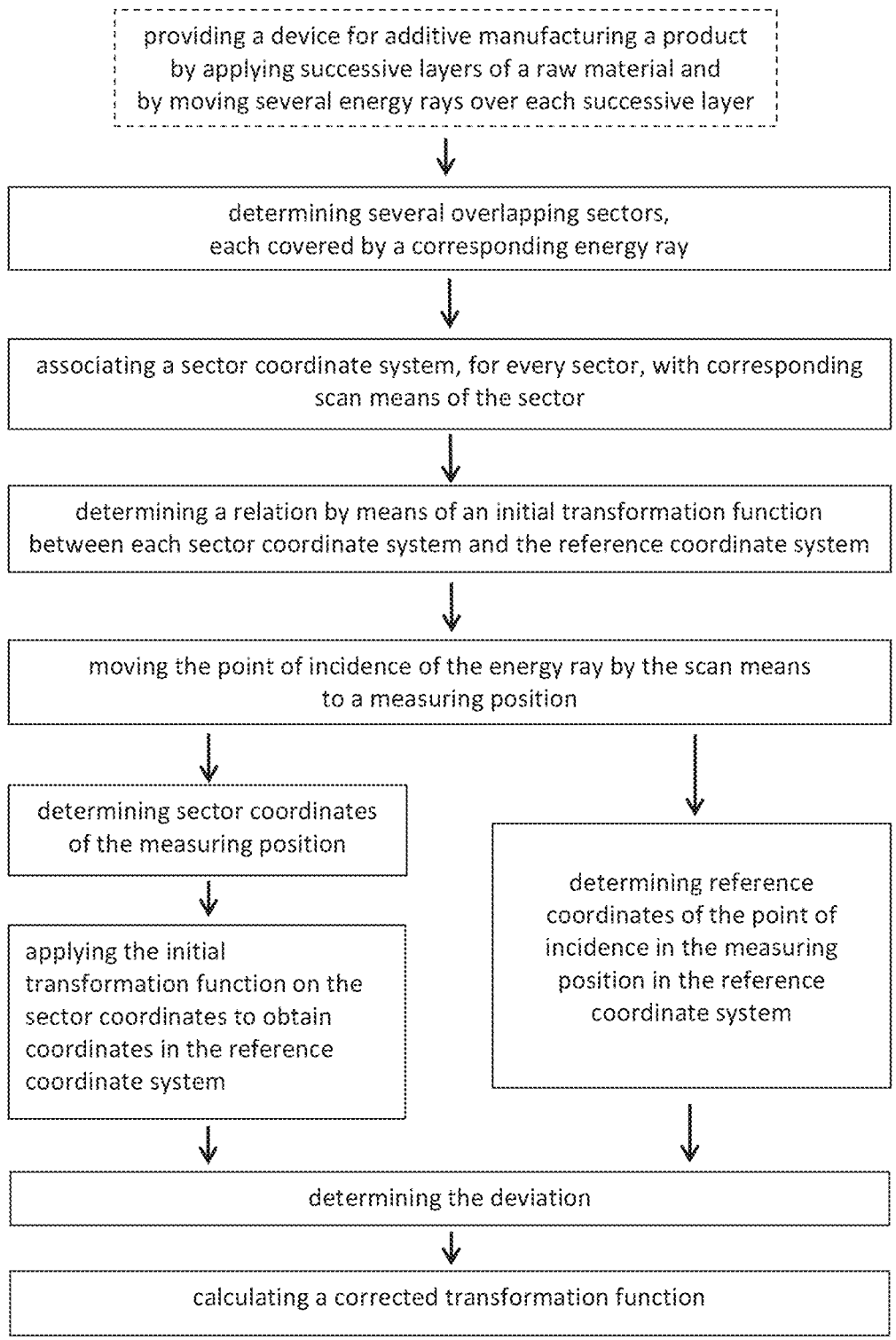
FIG. 7 is a flow diagram of the method steps according to the invention for calibrating a device.

The embodiment of the invention which is represented in FIG. 5 is different from the first-described embodiment of the invention in that a reference coordinate system $X_R Y_R Z_R$ is selected which is fixed for the scan means of one of the sectors $S_1$ or $S_2$. Consequently, in such a case is selected a sector coordinate system for the reference coordinate system which is associated to the scan means of one of said sectors.

In such an embodiment, the reference coordinates of the measuring positions 13 in the reference coordinate system $X_R Y_R Z_R$ can be determined for example by making the ray 7 hit the sensors 14 situated in the measuring positions. When it is thus detected that the point of incidence of the ray 7 is situated in the sensor 14 of a point of measurement 13, the corresponding coordinates of this point of measurement 13 in the reference coordinate system will be known.

These measuring positions for calibrating the scan means are selected in the part of the sector which is associated with the reference coordinate system, whereby this part preferably overlaps with the sector of the scan means to be calibrated. Normally, two, three or more measuring positions will be selected in such an overlapping part.

When a reference coordinate system $X_R Y_R Z_R$ is selected which is fixed for the scan means of one of the sectors of the device, a relative calibration will consequently be carried out by the method of the invention.

In a variant of the embodiment of the method and device according to the invention, said sensors are replaced by a camera system. Such a camera system may comprise a camera for each measuring position or a camera observing two or more measuring positions 13 or all measuring positions 13. These cameras consist for example of a matrix camera and they make it possible to determine the coordinates of the point of incidence in the build plane 12 of an energy ray in relation to a reference coordinate system which is fixed with respect to these cameras.

FIG. 4 schematically represents a construction zone 9 with two sectors $S_1$ and $S_2$, whereby a camera is provided for every selected measuring position 13. The field of view 16 of these cameras includes the measuring position 13 concerned and extends in a zone around this measuring position 13.

In order to calibrate the scan means of for example sector $S_1$, they will be controlled to move the point of incidence of the energy ray to a point of measurement 13 with $(x_1,y_1)$ as known coordinates in the reference coordinate system. If the scan means are not correctly calibrated, however, the point of incidence will be moved to a position with coordinates $(x_r,y_r)$ in the reference coordinate system, whereby $(x_r,y_r)=F_1(x_{s1},y_{s1})$ and $(x_{s1},y_{s1})$ are the sector coordinates of the point of measurement 13.

Next, by means of the camera, the actual coordinates $(x_r,y_r)$ of the point of incidence in the reference coordinate system are measured, whereby $(x_r,y_r)=(x_1+a,y_1+b)$ and the values (a,b) represent the deviation that needs to be corrected.

On the basis of this deviation (a,b) is then calculated a corrected transformation function $F_{C1}$ for the scan means of the sector $S_1$ for at least one measuring position, and preferably for two, three or more measuring positions. The coordinates of the measuring positions 13 in the reference coordinate system will then be practically equal to the coordinates obtained by applying the corrected transformation function $F_{C1}$ to the sector coordinates of these measuring positions.

In the preceding embodiments of the method and device according to the invention, sensors 14 of one or several cameras are used to determine the reference coordinates of the point of incidence in the measuring position. However, in a variant embodiment, these reference coordinates are determined by measuring a position with maximum levels of electromagnetic radiation in the reference coordinate system. The position with this maximum radiation corresponds to the position of said point of incidence then.

According to yet another embodiment of the invention, one or several measuring positions can be selected in a reference element that can be moved over the construction zone. In that case, said sensor 14 is provided for example on this reference element, and the movement of the reference element is measured in the reference coordinate system. Such a reference element may be formed for example by said distributing member 3.

According to an interesting embodiment, two or more energy rays can be controlled by the same scan means. The method according to the invention then allows to calibrate a relevant transformation function for every energy ray, whereby depending on the energy ray that is active, a corresponding transformation function will be used.

The method according to the invention thus allows to calibrate these different transformation functions in relation to a single reference coordinate system.

The invention claimed is:

1. A method for calibrating a device designed for manufacturing at least one object by an additive manufacturing technique starting from a raw material, the method comprising:
    applying the raw material in successive layers in a construction zone wherein each of these successive layers defines one and the same build plane;
    after the application of each layer, moving several energy rays over this layer so as to form successive cross-sections of said object and to thus build the latter layer by layer;
    wherein, in said construction zone, several sectors are determined extending at least in this construction zone, wherein every sector is covered by at least one corresponding energy ray;
    wherein, for every sector, corresponding scan means are controlled to move the point of incidence of the ray in the construction zone over said sector according to a predetermined pattern so as to form said successive cross-sections;
    wherein for every sector a sector coordinate system is associated with the corresponding scan means of this sector, and a relation between each sector coordinate system and a single reference coordinate system is determined by an initial transformation function;
    wherein at least one of said sectors extends at least partially over two or more of the other sectors;
    moving said point of incidence by said scan means to at least one measuring position;
    wherein the at least one measuring position has sector coordinates which are defined in the sector coordinate system associated with said scan means;
    determining reference coordinates of the point of incidence in this measuring position in said reference coordinate system;
    determining for at least one measuring position, deviation between said reference coordinates of the point of incidence and coordinates in said reference coordinate system of said measuring position, obtained by applying said initial transformation function on said sector coordinates;
    calculating a corrected transformation function on the basis of the thus determined deviation for at least one measuring position, and preferably for two, three or more measuring positions, such that the coordinates of said measuring position in said reference-coordinate system are substantially equal to the coordinates obtained by applying the corrected transformation function to the sector coordinates of the measuring position.

2. The method according to claim 1, wherein said sectors are selected such that connecting sectors at least partially overlap, wherein at least one measuring position, and preferably two, three or more measuring positions are selected which are common to said connecting sectors.

3. The method according to claim 1, wherein a detection position is selected for said measuring position with known coordinates in said reference coordinate system, wherein it is detected when the point of incidence is situated in this detection position so as to determine said sector coordinates of said measuring position, wherein the reference coordinates of said point of incidence are thus identical to those of the detection position in said reference coordinate system, wherein said deviation is subsequently determined.

4. The method according to claim 3, wherein said point of incidence is moved to said measuring position by scanning a zone containing said detection position with said ray.

5. The method according to claim 3, wherein it is detected whether the point of incidence is situated in said detection position by measuring the intensity of the point of incidence of said ray in this detection position.

6. The method according to claim 3, wherein it is detected whether the point of incidence is situated in said detection position by means of a camera or by means of a sensor provided on said detection position.

7. The method according to claim 1, wherein the reference coordinates of said point of incidence in the measuring position are measured by means of a camera system which is fixed in relation to said reference coordinate system and which contains one or several cameras.

8. The method according to claim 1, wherein the reference coordinates of said point of incidence in the measuring position are determined by measuring a position with maximum electromagnetic radiation in said reference coordinate system, wherein the position with this maximum radiation corresponds to the position of said point of incidence.

9. The method according to claim 1, wherein a movable reference element is moved over the construction zone, wherein said measuring position is selected on this reference element.

10. The method according to claim 1, wherein said measuring position is selected outside said construction zone.

11. The method according to claim 10, wherein said measuring position is located in said build plane.

12. The method according to claim 10, wherein said measuring position is located on a top side of a frame of said device, said top side extending in said build plane.

13. The method according to claim 1, wherein said reference coordinate system is selected fixed in relation to said object, wherein said measuring position is selected in a most recently manufactured cross-section of said object.

14. The method according to claim 1, wherein a sector coordinate system is selected for said reference coordinate system, associated with the scan means of one of said sectors.

15. The method according to claim 1, wherein said reference coordinate system is fixed in relation to said build plane.

16. A device for applying the method according to claim 1.

* * * * *